United States Patent
You et al.

(10) Patent No.: US 12,526,981 B2
(45) Date of Patent: Jan. 13, 2026

(54) SEMICONDUCTOR STRUCTURE WITH A HIGH DEPTH-WIDTH RATIO CAPACITOR AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Kang You, Hefei (CN); Jie Bai, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

(*) Notice: Subject to any disclaimer, the term of this patent is extended or adjusted under 35 U.S.C. 154(b) by 623 days.

(21) Appl. No.: 18/054,994

(22) Filed: Nov. 14, 2022

(65) Prior Publication Data

US 2023/0171947 A1    Jun. 1, 2023

(30) Foreign Application Priority Data

Nov. 30, 2021   (CN) .......................... 202111440253.7

(51) Int. Cl.
*H10B 12/00* (2023.01)
*H10D 1/00* (2025.01)
*H10D 1/68* (2025.01)

(52) U.S. Cl.
CPC ........... *H10B 12/312* (2023.02); *H10B 12/03* (2023.02); *H10D 1/042* (2025.01); *H10D 1/714* (2025.01); *H10D 1/716* (2025.01)

(58) Field of Classification Search
CPC .... H10B 12/312; H10B 12/03; H10B 12/033; H10B 12/315; H10B 12/30; H10B 12/34;
(Continued)

(56) References Cited

U.S. PATENT DOCUMENTS 6,624,040 B1 * 9/2003 Ng ....................... H10D 84/212
257/E21.018
7,449,739 B2 * 11/2008 Heitmann .............. H10D 1/716
257/306

(Continued)

FOREIGN PATENT DOCUMENTS

CN          110970401 A      4/2020

*Primary Examiner* — Duy T Nguyen
(74) *Attorney, Agent, or Firm* — Kilpatrick Townsend & Stockton LLP

(57) ABSTRACT

The present disclosure provides a semiconductor structure and a manufacturing method thereof. The manufacturing method includes: forming a capacitor on a substrate, where a first support layer is provided between parts of the first electrodes in the capacitor away from the substrate; removing part of a second electrode and part of a first dielectric layer to expose a surface of the first support layer away from the substrate; forming, on the surface of the first support layer away from the substrate, a second support layer having a first hole structure; forming, on a side surface of the first hole structure, a third electrode in contact with the first electrode; forming a second dielectric layer covering the third electrode and being in contact with the first dielectric layer; and forming, on a side surface of the second dielectric layer, a fourth electrode in contact with the second electrode.

13 Claims, 12 Drawing Sheets

(58) Field of Classification Search
CPC ........ H10B 12/02; H10D 1/042; H10D 1/714;
H10D 1/716
USPC ........................................................ 438/396
See application file for complete search history.

(56) References Cited

U.S. PATENT DOCUMENTS

| | | | |
|---|---|---|---|
| 2005/0087789 A1* | 4/2005 | Baik | H01L 21/28556 |
| | | | 438/665 |
| 2006/0079049 A1* | 4/2006 | Kundalgurki | H10B 12/033 |
| | | | 438/243 |
| 2008/0121960 A1* | 5/2008 | Ohuchi | H10B 12/0335 |
| | | | 257/E29.345 |
| 2010/0052098 A1* | 3/2010 | Miyajima | H10B 12/0335 |
| | | | 257/532 |
| 2015/0214293 A1* | 7/2015 | Liao | H10D 1/716 |
| | | | 257/532 |
| 2015/0221718 A1* | 8/2015 | Rhie | H10B 12/05 |
| | | | 438/386 |
| 2022/0285481 A1* | 9/2022 | Zhan | H10D 1/042 |

* cited by examiner

SEMICONDUCTOR STRUCTURE WITH A HIGH DEPTH-WIDTH RATIO CAPACITOR AND MANUFACTURING METHOD THEREOF

CROSS-REFERENCE TO RELATED APPLICATION

This application claims the priority of Chinese Patent Application No. 202111440253.7, submitted to the Chinese Intellectual Property Office on Nov. 30, 2021, the disclosure of which is incorporated herein in its entirety by reference.

TECHNICAL FIELD

The present application relates to the technical field of semiconductors, and in particular to a semiconductor structure and a manufacturing method thereof.

BACKGROUND

With the continuous development of the semiconductor technology, semiconductor structures are widely applied. In the field of computer and communication, semiconductor structures with different functions are needed. As an important semiconductor structure, the capacitor has functions such as voltage regulation and filtering, and therefore is widely used in integrated circuits, for example, in a dynamic random access memory (DRAM) or static random access memory (SRAM).

The DRAM is generally composed of multiple memory cells. Each memory cell typically includes a transistor and a capacitor. The transistor controls the reading and writing of data information in the capacitor. A gate of the transistor is electrically connected to a word line (WL) of the DRAM, and the on and off of the transistor is controlled by the voltage on the WL. One of a source and a drain of the transistor is electrically connected to a bit line (BL), and the other of the source and the drain is electrically connected to the capacitor. Data information is stored or outputted by using the BL.

In the DRAM, the capacity of the capacitor has an important impact on the operating performance of the DRAM. In order to increase the capacity of the capacitor, the capacitor usually has a large depth-to-width ratio to increase an electrode area of the capacitor. However, it is difficult to manufacture a capacitor with a high depth-to-width ratio and to further increase the depth-to-width ratio.

SUMMARY

In view of the above problems, embodiments of the present disclosure provide a semiconductor structure and a manufacturing method thereof.

A first aspect of the embodiments of the present disclosure provides a method of manufacturing a semiconductor structure, including: forming a capacitor on a substrate, where the capacitor includes a plurality of first electrodes arranged at intervals, a first dielectric layer covers a side surface and a top surface of each of the first electrodes, a second electrode covers the first dielectric layer, and a first support layer is provided between parts of the first electrodes away from the substrate; removing part of the second electrode and part of the first dielectric layer to expose a surface of the first support layer away from the substrate; forming, on the surface of the first support layer away from the substrate, a second support layer having a first hole structure, where the first support layer and the second support layer form a new first support layer; forming, on a side surface of the first hole structure, a third electrode in contact with the first electrode, where the first electrode and the third electrode form a new first electrode; forming a second dielectric layer covering the third electrode and being in contact with the first dielectric layer, where the first dielectric layer and the second dielectric layer form a new first dielectric layer; and forming, on a side surface of the second dielectric layer, a fourth electrode in contact with the second electrode, where the second electrode and the fourth electrode form a new second electrode.

A second aspect of the embodiments of the present disclosure provides a semiconductor structure, which is formed by using the foregoing method of manufacturing a semiconductor structure. Details are not described herein again.

DETAILED DESCRIPTION

In order to improve the depth-to-width ratio of the capacitor while reducing the manufacturing difficulty of the capacitor, in the method of manufacturing a semiconductor structure according to the embodiments of the present disclosure, a surface, which is away from a substrate, of a first support layer between first electrodes is exposed, and a second support layer is formed on the surface, where the second support layer has a first hole structure. A third electrode, a second dielectric layer, and a fourth electrode are sequentially formed in the first hole structure, where the third electrode is in contact with the first electrode, the second dielectric layer is in contact with the first dielectric layer, and the fourth electrode is in contact with the second electrode, such that the height of the capacitor along a direction perpendicular to the substrate is increased while the width remains unchanged, thereby increasing a depth-to-width ratio. In addition, the third electrode, the second dielectric layer, and the fourth electrode are added at the top of the capacitor to increase the depth-to-width ratio of the capacitor, which reduces the manufacturing difficulty compared with forming a capacitor having a high depth-to-width ratio through etching.

In order to make the objectives, features and advantages of the embodiments of the present application clearer, the technical solutions in the embodiments of the present application are described clearly and completely below with reference to the accompanying drawings in the embodiments of the present application. Apparently, the described embodiments are some rather than all of the embodiments of the present application. All other embodiments obtained by those of ordinary skill in the art based on the embodiments of present application without creative efforts should fall within the protection scope of the present application.

Figure 1:
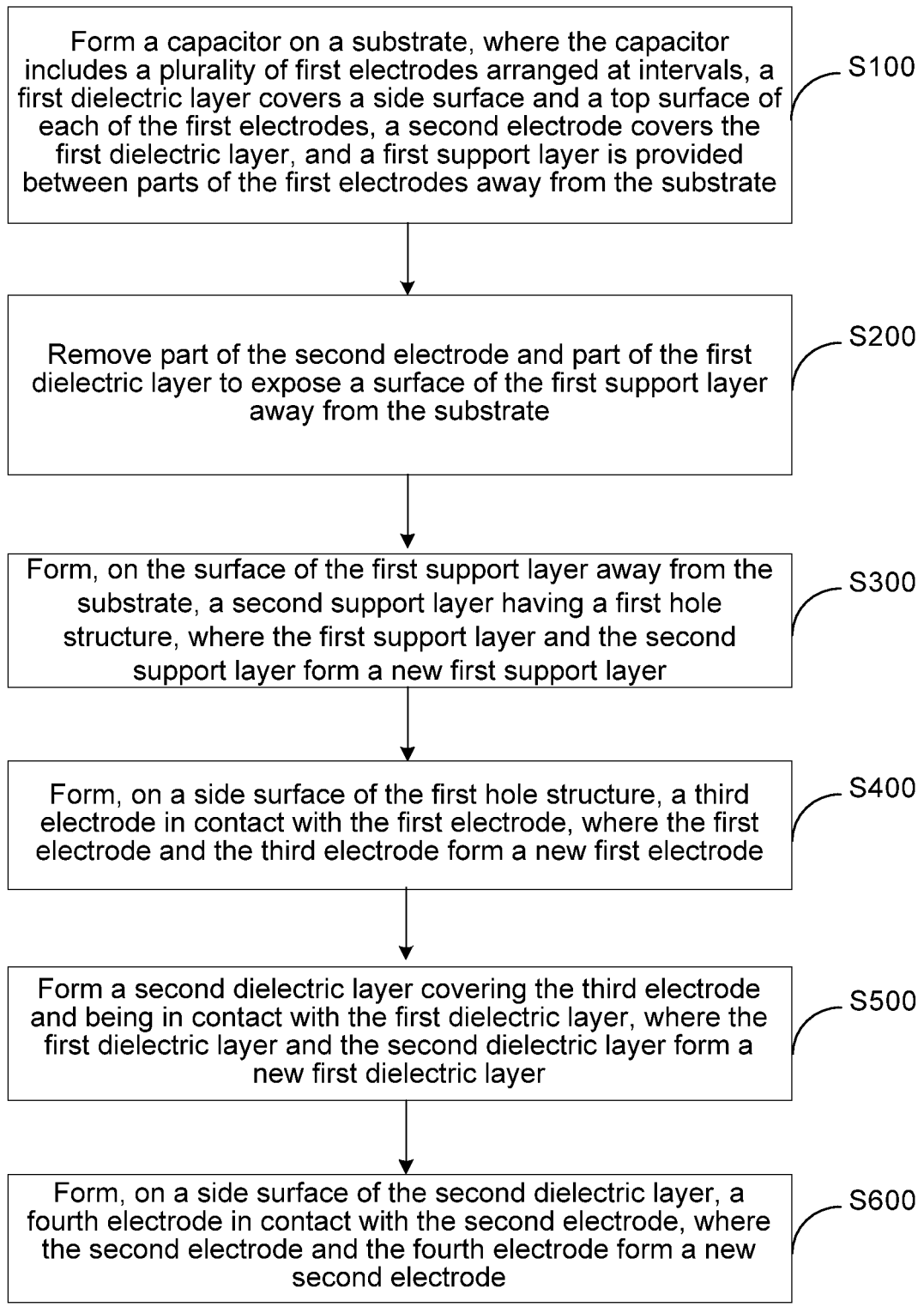
FIG. 1 is a flowchart of a method of manufacturing a semiconductor structure according to an embodiment of the present disclosure.

Referring to FIG. 1, FIG. 1 is a flowchart of a method of manufacturing a semiconductor structure according to an embodiment of the present disclosure. The manufacturing method includes the following steps:

Step S100: Form a capacitor on a substrate, where the capacitor includes a plurality of first electrodes arranged at intervals, a first dielectric layer covers a side surface and a top surface of each of the first electrodes, a second electrode covers the first dielectric layer, and a first support layer is provided between parts of the first electrodes away from the substrate.

Figure 2:
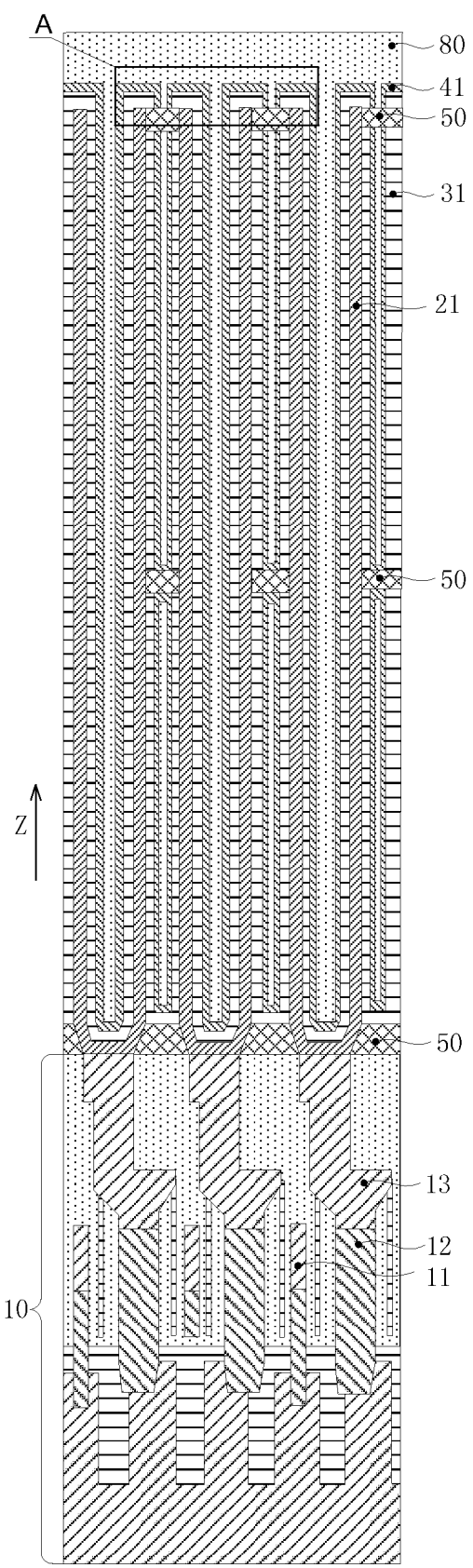
FIG. 2 is a schematic structural diagram of a capacitor according to an embodiment of the present disclosure.
Figure 3:
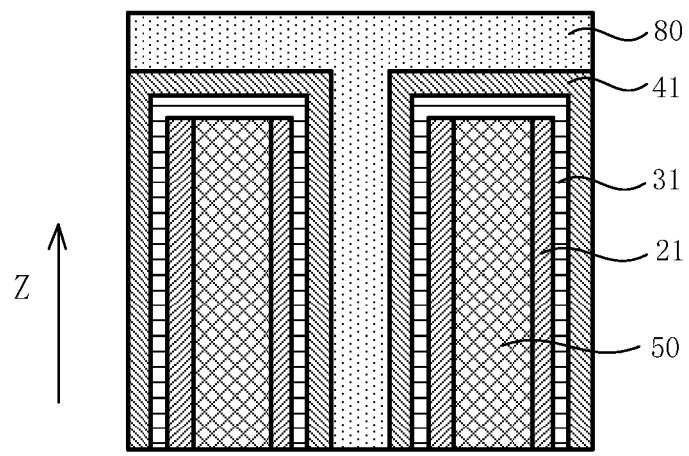
FIG. 3 is a partial enlarged view of position A in FIG. 2.

Referring to FIG. 2 and FIG. 3, a plurality of bit lines 11 extending along a first direction and arranged at intervals, and a plurality of word lines (not shown) extending along a second direction and arranged at intervals are formed in the substrate 10. There is an included angle between the first direction and the second direction. For example, the first direction may be perpendicular to the second direction. The word line may be a buried word line. Along a direction perpendicular to the substrate 10 (direction Z shown in FIG. 2 and FIG. 3), the word line is located under the bit line 11, that is, the word line is located at a deeper position in the substrate 10 than the bit line 11.

A plurality of capacitor plugs 12 arranged at intervals are provided between adjacent bit lines 11, and the capacitor plugs 12 are insulated from each other. A contact pad 13 is provided at a side of the capacitor plug 12 away from the substrate 10. The contact pad 13 is exposed from the surface of the substrate 10, so as to be in contact with the capacitor to implement electrical connection. The capacitor plug 12 may be made of polysilicon, and the contact pad 13 is made of tungsten. A diffusion barrier layer is provided at least between the contact pad 13 and the capacitor plug 12 to prevent diffusion of tungsten. The diffusion barrier layer may be made of titanium nitride.

As shown in FIG. 2, with a surface perpendicular to the extension direction of the bit line 11 as a cross section, the cross section of the contact pad 13 is substantially Z-shaped. Such a configuration can adjust the size of the surface of the contact pad 13 away from the substrate 10, such that the area of the surface is larger than an area of a contact surface between the contact pad 13 and the capacitor plug 12, that is, the area of the top surface of the contact pad 13 is larger than the area of the bottom surface of the contact pad 13. In this way, an alignment speed of the capacitor and the contact pad 13 on the substrate 10 is faster than an alignment speed of the capacitor and the capacitor plug 12, thereby improving the manufacturing efficiency of the semiconductor structure. On the other hand, through the contact pads 13, hexagonal closed-packed capacitors can be formed on the capacitor plugs 12 arranged in an array, which improves the arrangement density of the capacitors, thereby improving the memory capacity of the semiconductor structure.

Further referring to FIG. 2 and FIG. 3, the capacitor is formed on the substrate 10. The capacitor includes a first electrode 21 and a second electrode 41 arranged opposite to each other, and a first dielectric layer 31 arranged between the first electrode 21 and the second electrode 41. Specifically, a plurality of first electrodes 21 are provided. The plurality of first electrodes 21 are arranged at intervals, and each first electrode 21 is in contact with one contact pad 13. That is, a bottom surface of each first electrode 21 is in direct contact with the contact pad 13.

A side surface and a top surface of each first electrode 21 are covered by the first dielectric layer 31. The top surface of the first electrode 21 refers to a surface of the first electrode 21 away from the substrate 10, and a side surface of the first electrode 21 refers to a surface between the top surface and the bottom surface of the first electrode 21. When the first electrode 21 is a columnar electrode, the side surface of the first electrode 21 refers to an outer circumferential surface of the columnar electrode. When the first electrode 21 is a tubular electrode, the side surface of the first electrode 21 refers to an outer circumferential surface and an inner circumferential surface of the tubular electrode.

The first dielectric layer 31 is covered by the second electrode 41. That is, the first dielectric layer 31 corresponding to the first electrodes 21 is formed as a whole, and the second electrode 41 corresponding to the first electrodes 21 is also formed as a whole, to facilitate formation of the first dielectric layer 31 and the second electrode 41, to reduce manufacturing steps of the capacitor.

Further referring to FIG. 2 and FIG. 3, to reduce of collapsing of the first electrodes 21 and contact between the first electrodes 21 due to the instability of the first electrodes 21, a first support layer 50 is provided between parts of the first electrodes 21 away from the substrate 10, that is, the first support layer 50 is provided between top regions of the first electrodes 21. Certainly, if a plurality of first support layers 50 are provided, the first support layers 50 may further be provided at a middle region and a bottom region of the first electrode 21. As shown in FIG. 2, a bottom region, middle region, and top region of an outer side surface of the first electrode 21 are each provided with one first support layer 50, to further improve the stability of the first electrode 21.

In a possible example, as shown in FIG. 3, a surface of the first support layer 50 away from the substrate 10 is flush with the surface of the first electrode 21 away from the substrate 10. That is, as shown in FIG. 3, a top surface 51 of the first support layer is flush with the top surface of the first electrode 21.

Step S200: Remove part of the second electrode and part of the first dielectric layer to expose a surface of the first support layer away from the substrate.

Figure 4:
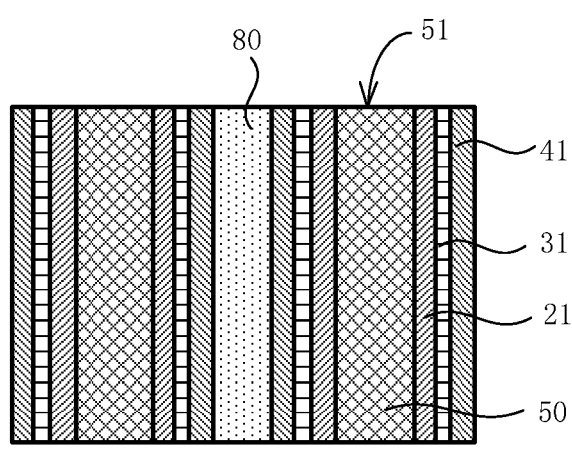
FIG. 4 is a schematic structural diagram after removal of part of a first dielectric layer according to an embodiment of the present disclosure.

Referring to FIG. 3 and FIG. 4, the second electrode 41 and the first dielectric layer 31 located above the first support layer 50 are removed, to expose the top surface 51 of the first support layer. The top surface 51 of the first support layer refers to the surface of the first support layer 50 away from the substrate 10, that is, the upper surface as shown in FIG. 3 and FIG. 4. The top surface 51 of the first support layer is exposed to serve as a support surface, such that a second support layer 60 (referring to FIG. 6) is formed on the surface subsequently. The second support layer 60 and the first support layer 50 form a new first support layer, to increase the height of the first support layer. For example, the first electrode 21, the second electrode 41, and the first dielectric layer 31 are removed through dry etching with a chlorine-based gas. For example, the chlorine-based gas may include at least one from the group consisting of chlorine gas, monochloromethane or dichloromethane.

In a possible example, as shown in FIG. 3 and FIG. 4, after part of the second electrode 41 and part of the first dielectric layer 31 are removed, the top surface of the remaining second electrode 41 may be flush with the top surface 51 of the first support layer, and the top surface of the remaining first dielectric layer 31 may be flush with the top surface 51 of the first support layer. As shown in FIG. 4, only the top surface of the first support layer 50 is exposed.

Step S300: Form, on the surface of the first support layer away from the substrate, a second support layer having a first hole structure, where the first support layer and the second support layer form a new first support layer.

Figure 5:
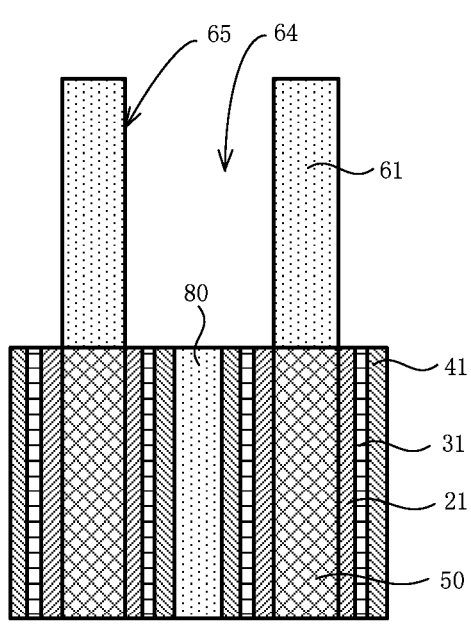
FIG. 5 is a schematic structural diagram after formation of an extension layer according to an embodiment of the present disclosure.
Figure 6:
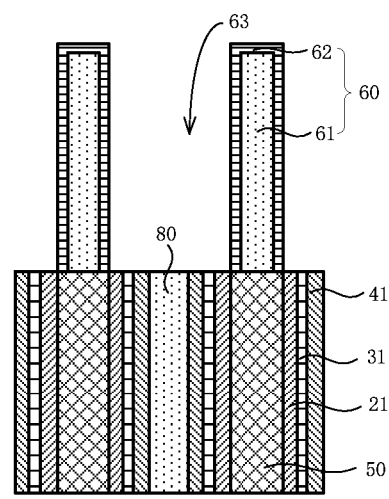
FIG. 6 is a schematic structure diagram of after formation of an insulating layer according to an embodiment of the present disclosure.

Referring to FIG. 4 to FIG. 6, a second support layer 60 is formed on the top surface 51 of the first support layer, where the second support layer 60 may be aligned with the first support layer 50. The second support layer 60 and the first support layer 50 form a new first support layer. With a plane parallel to the substrate 10 as a cross section, a cross-sectional shape of the second support layer 60 is the same as that of the first support layer 50. The second support layer 60 has a first hole structure 63 that exposes the first electrode 21, the first dielectric layer 31, and the second electrode 41.

In a possible example, as shown in FIG. 5 and FIG. 6, the second support layer 60 includes an extension layer 61 and an insulating layer 62 covering the extension layer 61. Such a configuration can insulate the extension layer 61 from other structures, to ensure normal operation of the capacitor. The step of forming, on the surface of the first support layer away from the substrate, a second support layer having a first hole structure may include the following process:

forming an extension layer on an exposed surface of the first support layer, where the extension layer has a second hole structure. As shown in FIG. 5, an extension layer 61 is formed on the first support layer 50 through selective epitaxial growth, such that the extension layer 61 grows along the direction perpendicular to the substrate 10.

Specifically, a material of the extension layer 61 contains a group III element or a group V element, for example, a silicon element. A material of the first support layer 50 contains the same group III element or group V element as the material of the extension layer 61. That is, the first support layer 50 contains the silicon element. For example, the material of the first support layer 50 is silicon nitride, silicon oxide or silicon oxynitride. The first electrode 21 and the second electrode 41 may be made of a conductive material with certain strength and easy to etch, and the first dielectric layer 31 may be made of an insulating material. Besides, none of the materials of the first electrode 21, the second electrode 41 and the first dielectric layer 31 contains the same group III element or group V element as the material of the extension layer 61. For example, the materials of the first electrode 21, the second electrode 41, and the first dielectric layer 31 may contain no group III element or group V element, or contain a group III element or group V element other than the silicon element. For example, the first electrode 21 and the second electrode 41 may be made of titanium nitride, molybdenum nitride, ruthenium nitride or an alloy thereof; the first dielectric layer 31 may be made of hafnium oxide, zirconia, calcium titanate or barium titanate. In this way, the extension layer 61 can be formed on the first support layer 50, rather than on the first electrode 21, the second electrode 41 or the first dielectric layer 31.

After the extension layer is formed, the side surface of the second hole structure is etched to expose part of the surface of the first support layer away from the substrate. As shown in FIG. 5 and FIG. 6, a side surface 65 of the second hole structure is etched to remove part of the extension layer 61, such that diameters of the holes in the second hole structure 64 are increased, to expose part of the top surface of the first support layer 50. Orthographic projection of the remaining extension layer 61 on the substrate 10 is located within orthographic projection of the first support layer 50 on the substrate 10, and edges of the two pieces of orthographic projection are spaced apart, that is, the two pieces of orthographic projection do not intersect with each other.

An insulating layer is formed on the etched side surface of the second hole structure and the etched extension layer, and the insulating layer located in the second hole structure defines the first hole structure. As shown in FIG. 6, after the insulating layer 62 is formed on the etched side surface 65 of the second hole structure and the etched extension layer 61, the insulating layer 62 covers the extension layer 61, that is, all surfaces of the extension layer 61 are covered by the insulating layer 62, such that the extension layer 61 has no exposed part, thereby insulating the extension layer 61. For example, a passivation film is formed on the surface of the extension layer 61 through a passivation process, and the passivation film serves as the insulating layer 62. For example, the passivation film is formed on the surface of the extension layer 61 through a deposition process or a thermal oxidation process.

Step S400: Form, on a side surface of the first hole structure, a third electrode in contact with the first electrode, where the first electrode and the third electrode form a new first electrode.

Figure 7:
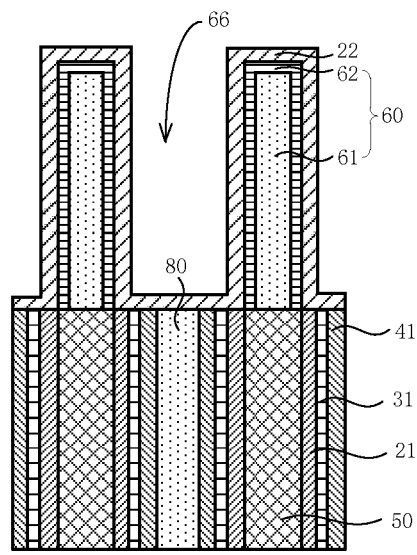
FIG. 7 is a schematic structural diagram after formation of a third electrode layer according to an embodiment of the present disclosure.
Figure 8:
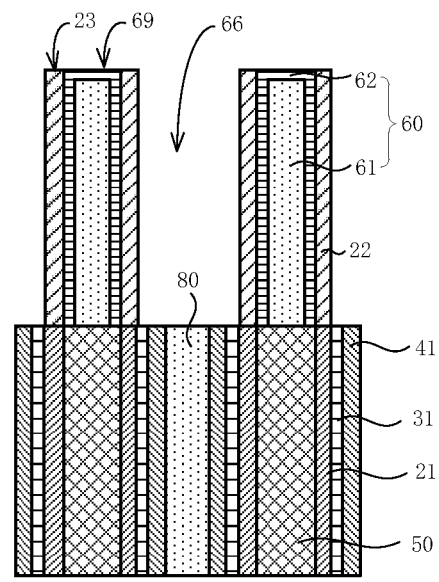
FIG. 8 is a schematic structural diagram after removal of part of a third electrode according to an embodiment of the present disclosure.

Referring to FIG. 6 to FIG. 8, a material of the third electrode 22 may be the same as that of the first electrode 21, such that the third electrode 22 and the first electrode 21 are formed as a whole, to reduce layering and contact resistance between the third electrode 22 and the first electrode 21. The third electrode 22 may be aligned with the first electrode 21, to reduce occlusion of the first dielectric layer 31. The first electrode 21 and the third electrode 22 form a new first electrode, which is higher compared with the first electrode 21.

In some possible examples, the step of forming, on a side surface of the first hole structure, a third electrode in contact with the first electrode may include the following process:

The third electrode is deposited on the side surface and a bottom surface of the first hole structure and on the second support layer, where the third electrode located in the first hole structure defines a third hole structure. As shown in FIG. 6 and FIG. 7, the third electrode 22 is deposited on the side surface and the bottom surface of the first hole structure 63 and on the second support layer 60 through a process such as chemical vapor deposition (CVD), physical vapor deposition (PVD) or atomic layer deposition (ALD). The third electrode 22 located in the first hole structure 63 defines a third hole structure 66.

After the third electrode is deposited, the third electrode is etched to remove the third electrode located on the second support layer and on the bottom surface of the third hole structure. As shown in FIG. 7 and FIG. 8, the third electrode 22 located on the second support layer 60 and on the bottom surface of the third hole structure 66 is removed through dry etching or wet etching, and the third electrode 22 located on the side surface of the second support layer 60 is retained, while the second support layer 60, the first dielectric layer 31, and the second electrode 41 are exposed. In some possible examples, referring to FIG. 9, a surface of the third electrode 22 away from the substrate is lower than the surface of the second support layer 60 away from the substrate 10, that is, a top surface 69 of the second support layer is higher than a top surface 23 of the third electrode. This facilitates forming the second dielectric layer 32 on the top surface 23 of the third electrode subsequently, so as to implement insulation between the third electrode 22 and the fourth electrode 42.

Step S500: Form a second dielectric layer covering the third electrode and being in contact with the first dielectric layer, where the first dielectric layer and the second dielectric layer form a new first dielectric layer.

Figure 9:
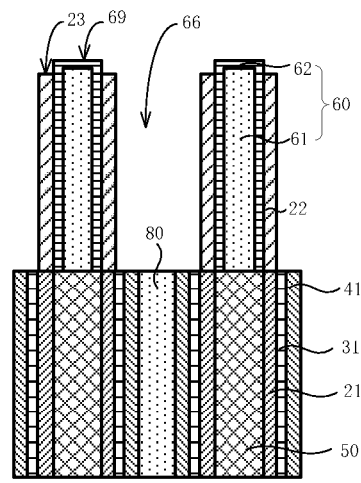
FIG. 9 is another schematic structural diagram after removal of part of a third electrode according to an embodiment of the present disclosure.
Figure 10:
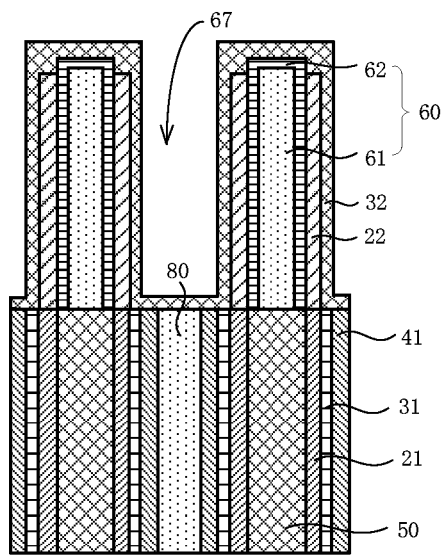
FIG. 10 is a schematic structural diagram after formation of a second dielectric layer according to an embodiment of the present disclosure.
Figure 11:
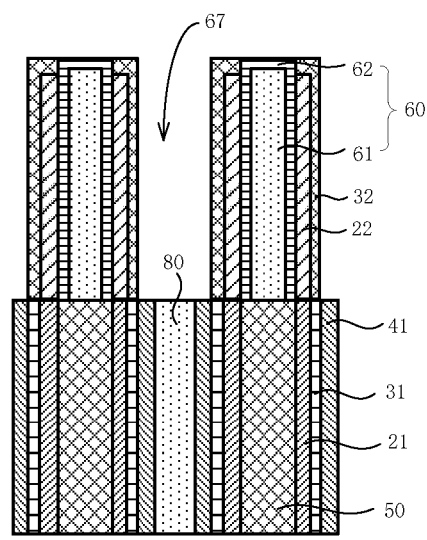
FIG. 11 is a schematic structural diagram after removal of part of a second dielectric layer according to an embodiment of the present disclosure.

Referring to FIG. 9 to FIG. 11, the second dielectric layer 32 covers the third electrode 22. The second dielectric layer 32 and the first dielectric layer 31 are in contact with each other to form a new first dielectric layer 31. The second dielectric layer 32 is aligned with the first dielectric layer 31, and a material of the second dielectric layer 32 may be the same as that of the first dielectric layer 31.

In a possible example, the step of forming a second dielectric layer covering the third electrode and being in contact with the first dielectric layer may include the following process:

The second dielectric layer is deposited on a side surface and a bottom surface of the third hole structure, the third electrode, and the second support layer, where the second dielectric layer located in the third hole structure defines a fourth hole structure. As shown in FIG. 9 and FIG. 10, the second dielectric layer 32 covers the bottom surface and the side surface of the third hole structure 66, the third electrode 22, and the second support layer 60. After the second dielectric layer 32 is formed, the third electrode 22 is covered. The second dielectric layer 32 located in the third hole structure 66 forms the fourth hole structure 67.

After deposition of the second dielectric layer, the second dielectric layer is etched to remove the second dielectric layer located on the second support layer and a bottom surface of the fourth hole structure. As shown in FIG. 10 and FIG. 11, part of the second dielectric layer 32 is removed along the direction perpendicular to the substrate 10 through anisotropic etching. After the second dielectric layer 32 is etched, the top surface of the second dielectric layer 32 may be flush with the top surface of the second support layer 60. The second support layer 60 and the second electrode 41 are exposed, while the top surface and side surface of the third electrode 22 are still covered by the second dielectric layer 32, such that the first electrode 21 is insulated. Certainly, after the second dielectric layer 32 is etched, the top surface of the second dielectric layer 32 may alternatively be higher than the top surface of the second support layer 60, that is, the second support layer 60 is also covered by the second dielectric layer 32.

Step S600: Form, on a side surface of the second dielectric layer, a fourth electrode in contact with the second electrode, where the second electrode and the fourth electrode form a new second electrode.

Figure 12:
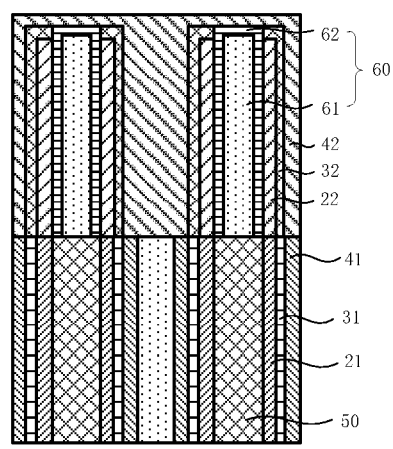
FIG. 12 is a schematic structural diagram after formation of a fourth electrode according to an embodiment of the present disclosure.

Referring to FIG. 11 and FIG. 12, the fourth electrode 42 is formed on the side surface of the second dielectric layer 32. The fourth electrode 42 and the second electrode 41 are in contact with each other to form a new second electrode. The fourth electrode 42 may be aligned with the second electrode 41, and a material of the fourth electrode 42 may be the same as that of the second electrode 41.

Figure 13:
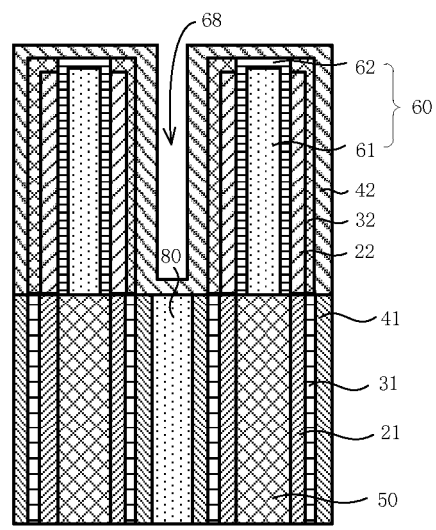
FIG. 13 is another schematic structural diagram after formation of a fourth electrode according to an embodiment of the present disclosure.

In some possible examples, the step of forming, on a side surface of the second dielectric layer, a fourth electrode in contact with the second electrode includes: depositing the fourth electrode in the fourth hole structure, on the second dielectric layer, and on the second support layer. As shown in FIG. 11 and FIG. 12, the fourth electrode 42 may fill up the fourth hole structure 67, Alternatively, as shown in FIG. 11 and FIG. 13, the fourth electrode 42 covers the side surface and the bottom surface of the fourth hole structure 67, and the fourth electrode 42 located in the fourth hole structure 67 defines a fifth hole structure 68.

In some possible examples, after the step of forming, on a side surface of the second dielectric layer, a fourth electrode in contact with the second electrode, where the second electrode and the fourth electrode form a new second electrode, the method further includes: depositing a first conductive layer on the fourth electrode, where a surface of the first conductive layer away from the substrate is higher than the surface of the fourth electrode away from the substrate.

Figure 14:
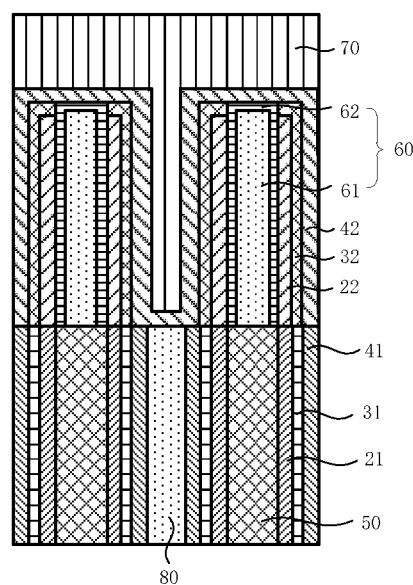
FIG. 14 is a schematic structural diagram after formation of a first conductive layer according to an embodiment of the present disclosure.

Referring to FIG. 14, the first conductive layer 70 is configured to connect the fourth electrode 42 to a peripheral circuit, and may be made of silicon germanide or other materials. When the fourth electrode 42 can fill up the fourth hole structure 67, the first conductive layer 70 covers the top surface of the fourth electrode 42. When the fourth electrode 42 does not fill up the fourth hole structure 67, the fifth hole structure 68 is filled with the first conductive layer 70 that covers the top surface of the fourth electrode 42. In this case, the first conductive layer 70 is made of a material with certain fluidity, to facilitate filling of the fifth hole structure 68. The first conductive layer 70 can also support the fourth electrode 42, to provide stability of the fourth electrode 42.

In the method of manufacturing a semiconductor structure provided by the embodiments of the present disclosure, a surface, which is away from a substrate 10, of a first support layer 50 between first electrodes 21 is exposed, and a second support layer 60 is formed on the surface, where the second support layer 60 has a first hole structure 63, that is, the first hole structure 63 is opposite to the capacitor. A third electrode 22, a second dielectric layer 32, and a fourth electrode 42 are sequentially formed in the first hole structure 63, where the third electrode 22 and the first electrode 21 are in contact with each other to form a new first electrode 21; the second dielectric layer 32 and the first dielectric layer 31 are in contact with each other to form a new first dielectric layer 31; the fourth electrode 42 and the second electrode 41 are in contact with each other to form a new second electrode 41. The new first electrode 21, new first dielectric layer 31, and new second electrode 41 form a new capacitor, and the height of the newly formed capacitor along a direction perpendicular to the substrate 10 is increased while the width remains unchanged, thereby increasing a depth-to-width ratio. In addition, the third electrode 22, the second dielectric layer 32, and the fourth electrode 42 are added at the top of the capacitor to increase the depth-to-width ratio of the capacitor, which reduces the manufacturing difficulty compared with forming a capacitor having a high depth-to-width ratio through etching.

Figure 15:
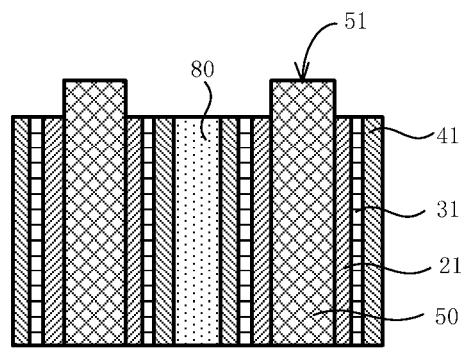
FIG. 15 is another schematic structural diagram after removal of part of a first dielectric layer according to an embodiment of the present disclosure.

In a possible example of the present disclosure, the step of removing part of the second electrode and part of the first dielectric layer to expose a surface of the first support layer away from the substrate includes: removing part of the second electrode, part of the first dielectric layer, and part of the first electrode, to expose the surface of the first support layer away from the substrate and part of a side surface of the first support layer away from the substrate. Referring to FIG. 3 and FIG. 15, the top surface 51 of the first support layer and part of the side surface connected to the top surface are exposed; the top surface of the first electrode 21, the top surface of the first dielectric layer 31, and the top surface of the second electrode 41 are all lower than the top surface 51 of the first support layer, which increases an exposed area of the first support layer 50 and makes it easier to form the second support layer 60 on the first support layer 50.

Figure 16:
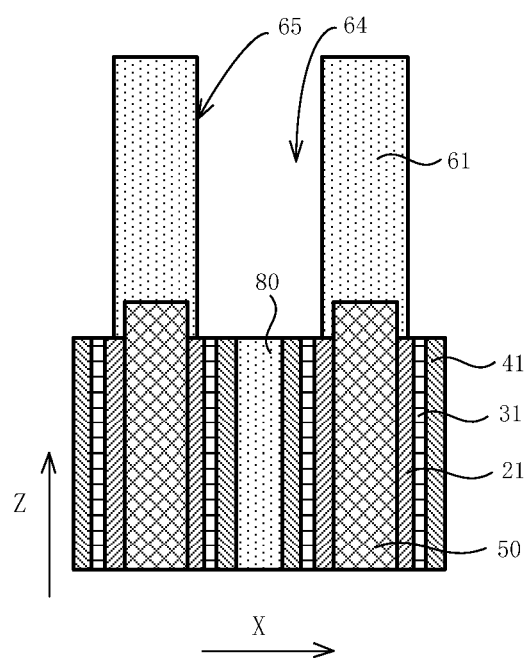
FIG. 16 is another schematic structural diagram after formation of an extension layer according to an embodiment of the present disclosure.

Referring to FIG. 15 and FIG. 16, by controlling growth rates of the extension layer 61 in different directions, the growth rate of the extension layer 61 along a direction perpendicular to the substrate 10 (direction Z shown in FIG. 16) is higher than the growth rate along a direction parallel to the substrate 10 (direction X shown in FIG. 16). Eventually, a thickness of the extension layer 61 located on the surface of the first support layer 50 away from the substrate 10 is greater than a thickness of the extension layer 61 located on the side surface of the first support layer 50, to ensure certain diameters of the holes in the second hole structure 64, thereby facilitating subsequent processing on the side surface of the second hole structure 64.

It may be understood that, the extension layer 61 has the second hole structure 64, and along the direction perpendicular to the substrate 10, a hole bottom of the second hole structure 64 is lower than the top surface 51 of the first support layer. Referring to FIG. 16, after the extension layer 61 is formed, during etching of the side surface 65 of the second hole structure, not only part of the surface of the first support layer 50 away from the substrate 10 but also part of the side surface of the first support layer 50 is exposed.

Figure 17:
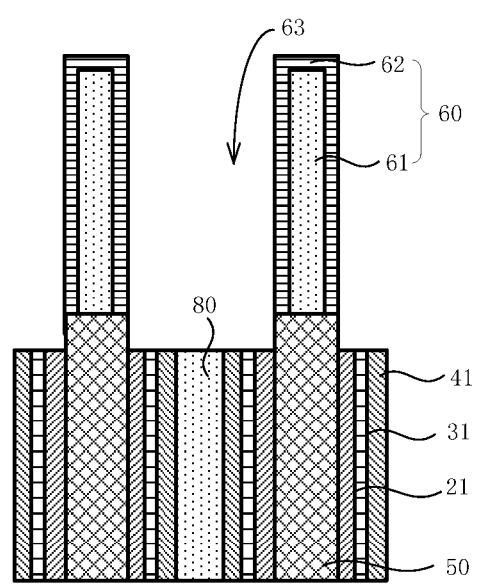
FIG. 17 is another schematic structural diagram after formation of an insulating layer according to an embodiment of the present disclosure.
Figure 18:
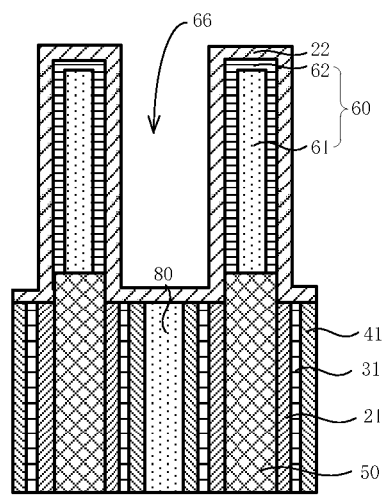
FIG. 18 is another schematic diagram after formation of a third electrode layer according to an embodiment of the present disclosure.
Figure 19:
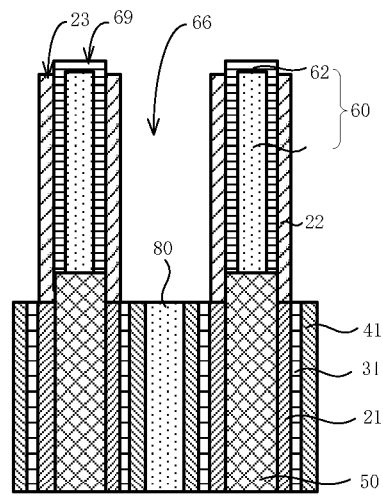
FIG. 19 is further another schematic structural diagram after removal of part of a third electrode according to an embodiment of the present disclosure.
Figure 20:
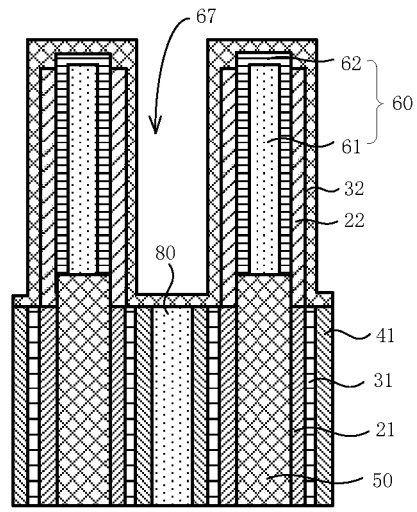
FIG. 20 is another schematic structural diagram after formation of a second dielectric layer according to an embodiment of the present disclosure.
Figure 21:
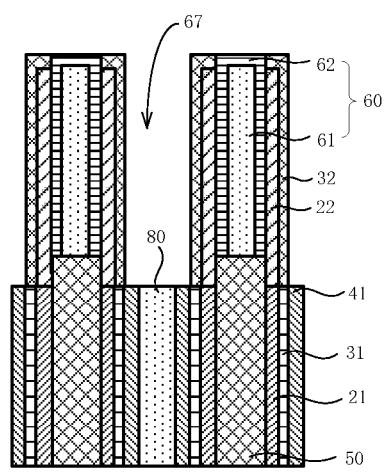
FIG. 21 is another schematic structural diagram after removal of part of a second dielectric layer according to an embodiment of the present disclosure.
Figure 22:
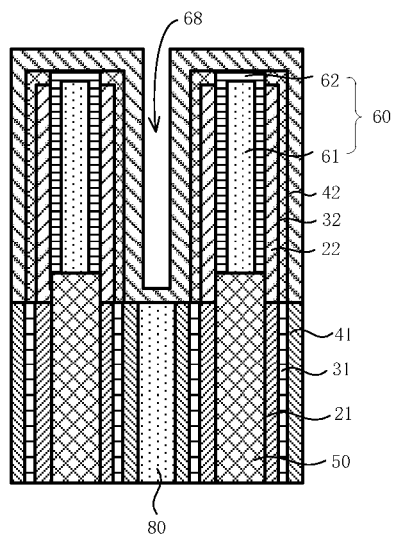
FIG. 22 is still another schematic structural diagram after formation of a fourth electrode according to an embodiment of the present disclosure.
Figure 23:
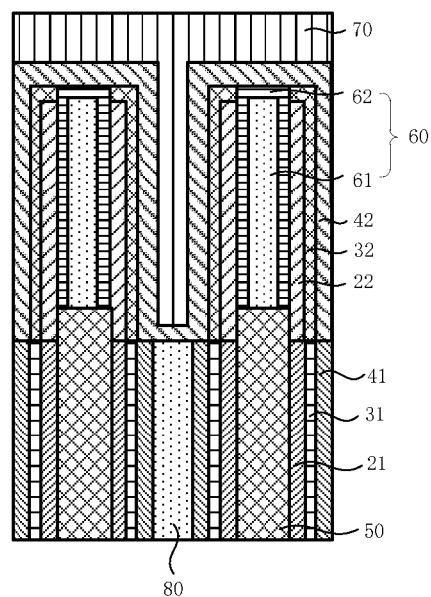
FIG. 23 is another schematic structural diagram after formation of a first conductive layer according to an embodiment of the present disclosure.

Referring to FIG. 17, an insulating layer 62 is formed on the etched side surface 65 of the second hole structure and the etched extension layer 61, where the insulating layer 62 covers the extension layer 61 but does not cover the side surface of the first support layer 50. For example, orthographic projection of the insulating layer 62 and the extension layer 61 on the substrate 10 overlap with orthographic projection of the first support layer 50 on the substrate 10. Referring to FIG. 18 to FIG. 23, for subsequent manufacturing steps, reference may be made to step S400 to step S600. Details are not described herein again.

In a possible example of the present disclosure, after the step of removing part of the second electrode and part of the first dielectric layer to expose a surface of the first support layer away from the substrate, the method further includes repeating the following steps at least twice:

The forming, on the surface of the first support layer away from the substrate, a second support layer having a first hole structure, where the first support layer and the second support layer form a new first support layer;

the forming, on a side surface of the first hole structure, a third electrode in contact with the first electrode, where the first electrode and the third electrode form a new first electrode;

the forming, on a side surface of the third electrode, a second dielectric layer in contact with the first dielectric layer, where the first dielectric layer and the second dielectric layer form a new first dielectric layer; and forming, on a side surface of the second dielectric layer, a fourth electrode in contact with the second electrode, where the second electrode and the fourth electrode form a new second electrode;

where the foregoing steps are repeated until a total height of the first electrode and the repeatedly formed third electrodes along a direction perpendicular to the substrate reaches a preset value.

In other words, heights of the new first electrode, new first dielectric layer, and new second electrode can be continuously increased to reach required heights, thereby further improving the depth-to-width ratio of the capacitor and reducing the manufacturing difficulty of the capacitor. For example, if the foregoing steps are repeated twice, the manufacturing process of the semiconductor structure in the embodiments of the present disclosure may include the following steps.

Step S001: Form a capacitor on a substrate, where the capacitor includes a plurality of first electrodes arranged at intervals, a first dielectric layer covers a side surface and a top surface of each of the first electrodes, a second electrode covers the first dielectric layer, and a first support layer is provided between parts of the first electrodes away from the substrate.

Step S002: Remove part of the second electrode and part of the first dielectric layer to expose a surface of the first support layer away from the substrate.

Step S003: Form, on the surface of the first support layer away from the substrate, a second support layer having a first hole structure, where the first support layer and the second support layer form a new first support layer.

Step S004: Form, on a side surface of the first hole structure, a third electrode in contact with the first electrode, where the first electrode and the third electrode form a new first electrode.

Step S005: Form a second dielectric layer on a side surface of the third electrode, where the second dielectric layer is in contact with the first dielectric layer, and the first dielectric layer and the second dielectric layer form a new first dielectric layer.

Step S006: Form, on a side surface of the second dielectric layer, a fourth electrode in contact with the second electrode, where the second electrode and the fourth electrode form a new second electrode.

Step S007: Form, on the surface of the first support layer away from the substrate, a second support layer having a first hole structure, where the first support layer and the second support layer form a new first support layer.

Step S008: Form a third electrode on a side surface of the first hole structure, where the third electrode is in contact with the first electrode, and the first electrode and the third electrode form a new first electrode.

Step S009: Form a second dielectric layer on a side surface of the third electrode, where the second dielectric layer is in contact with the first dielectric layer, and the first dielectric layer and the second dielectric layer form a new first dielectric layer.

Step S010: Form a fourth electrode on a side surface of the second dielectric layer, where the fourth electrode is in contact with the second electrode, and the second electrode and the fourth electrode form a new second electrode.

It should be noted that, in the process of forming, on a side surface of the second dielectric layer, a fourth electrode in contact with the second electrode, where the second electrode and the fourth electrode form a new second electrode (step S600), if the fourth electrode also covers the second support layer and the second dielectric layer, the fourth electrode located on the second support layer and the second dielectric layer is removed, and the fourth electrode located on the side surface of the second dielectric layer is retained, such that the second support layer is exposed, that is, a surface of the newly formed first support layer away from the substrate is exposed.

The structure of the capacitor in the embodiments of the present disclosure is not limited. The capacitor may be a single-sided capacitor or a double-sided capacitor. The first electrode 21 may be columnar or tubular. In some possible examples, the first electrode 21 is columnar and the second electrode 41 is tubular. The second electrode 41 is sleeved over the first electrode 21, and the first dielectric layer 31 is formed between the first electrode 21 and the second electrode 41. In this case, the capacitor is a single-sided capacitor.

Figure 24:
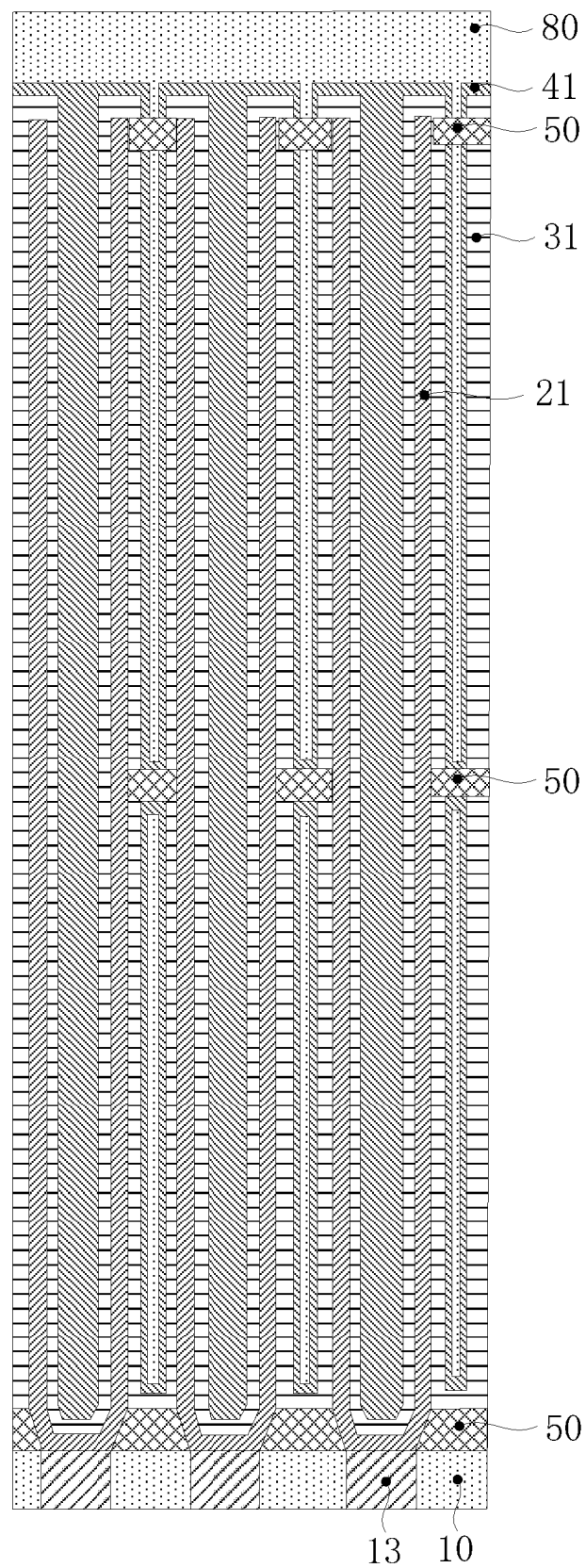
FIG. 24 is another schematic structural diagram of a capacitor according to an embodiment of the present disclosure.

In other possible examples, referring to FIG. 1 and FIG. 24, the first electrode 21 includes a bottom wall and a sidewall circumferentially surrounding the bottom wall. The bottom wall and the sidewall define a first space, that is, the first electrode 21 is tubular. To improve the capacity of the capacitor, part of the second electrode 41 is opposite to an inner surface of the first electrode 21 and part of the second electrode 41 is opposite to an outer surface of the first electrode 21. As shown in FIG. 24, the second electrode 41 in the first space may fill up the first space in which the first dielectric layer 31 has been formed. Alternatively, as shown in FIG. 1, a third space is formed between the second electrodes 41 in the second space.

Further referring to FIG. 1, the step of forming a capacitor on a substrate 10, where the capacitor includes a plurality of first electrodes 21 arranged at intervals, a first dielectric layer 31 covers a side surface and a top surface of the first electrode 21, a second electrode 41 covers the first dielectric layer 31, and a first support layer 50 is provided between parts of the first electrodes 21 away from the substrate 10 may include the following process:

The substrate 10 is provided, where a plurality of contact pads 13 arranged at intervals are formed in the substrate 10. The contact pads 13 are exposed from the surface of the substrate 10; and The plurality of first electrodes 21 arranged at intervals are formed on the substrate 10, where a bottom wall of each first electrode 21 is electrically connected to one of the contact pads 13. Specifically, a laminated structure is first formed on the substrate 10, where the laminated structure has a sixth hole structure that exposes the contact pad 13; then, the first electrode 21 is deposited on a side surface and a bottom surface of the sixth hole structure, where a bottom wall of the first electrode 21 is in contact with the contact pad 13 to implement electrical connection between the first electrode 21 and the contact pad 13. The laminated structure may include sacrificial layers and first support layers 50 that are sequentially laminated in turn, and an outermost layer of the laminated structure away from the substrate 10 is the first support layer 50. After the first electrode 21 is formed, the sacrificial layers are removed, and only the first support layers 50 are retained. For example, an etching hole that exposes the sacrificial layer is formed in the first support layer 50, and the sacrificial layer may be removed through the etching hole.

The first dielectric layer 31 covering the first electrodes 21 and the substrate 10 is formed, where the first dielectric layer 31 located in the first space defines a second space. The first dielectric layer 31 is formed through deposition, and the first dielectric layer 31 is an integrated layer. The first dielectric layer 31 covers the substrate 10, a side surface and bottom surface of the first space, and an outer circumferential surface of the first electrode 21.

The second electrode 41 covering the first dielectric layer 31 is formed, where the second electrode 41 located in the second space defines a third space. The second electrode 41 is formed through deposition, and the second electrode 41 covers the first dielectric layer 31. As shown in FIG. 1, the second electrode 41 is located on a side surface of the second space, and is not formed as a solid column, such that the size of the semiconductor structure can be further reduced.

It should be noted that, after the second electrode 41 covering the first dielectric layer 31 is formed, where the second electrode 41 located in the second space defines the third space, the method further includes: forming a second conductive layer 80 covering the second electrode 41, where the second conductive layer 80 fills up the third space and covers a surface of the substrate 10 away from the second electrode 41. As shown in FIG. 1, the second conductive layer 80 fills up a gap between the second electrode 41 and covers the second electrodes 41. The second conductive layer 80 is configured to connect the second electrode 41 to a peripheral circuit, and is also configured to support the second electrode 41, so as to prevent the second electrode 41 from collapsing and improving the stability of the second electrode 41.

Correspondingly, as shown in FIG. 3 and FIG. 4, the step of removing part of the second electrode 41 and part of the first dielectric layer 31 to expose a surface of the first support layer 50 away from the substrate 10 includes: removing part of the second conductive layer 80, part of the second electrode 41, and part of the first dielectric layer 31, to expose the surface of the first support layer 50 away from the substrate 10.

In a possible example, the second conductive layer 80 may include a first material layer close to the substrate 10, and a second material layer provided on a side of the first material layer away from the substrate 10. A material of the second material layer does not contain a same group III element or group V element as a material of the extension layer 61; a material of the first support layer 50 contains the same group III element or group V element as the material of the extension layer 61; none of materials of the first electrode 21, the second electrode 41, and the first dielectric layer 31 contains the same group III element or group V element as the material of the extension layer 61.

For example, the extension layer 61 contains a silicon element, the material of the first support layer 50 is a silicon-containing compound, the second material layer is a germanium layer, and the first material layer is a silicon germanide layer. None of the materials of the first electrode 21, the second electrode 41 and the first dielectric layer 31 contains the silicon element. During removal of the second conductive layer 80, the second material layer is partially etched through dry etching with a fluorine-based gas, until the second electrode 41 is exposed; then, the second electrode 41 is removed until the first support layer 50 is exposed. In this case, the second material layer still covers the first material layer, such that in subsequent formation of the extension layer 61, the extension layer 61 does not grow on the second material layer. The fluorine-based gas may include carbon tetrafluoride, sulfur hexafluoride or the like.

An embodiment of the present disclosure further provides a semiconductor structure, which is formed by using the foregoing method of manufacturing a semiconductor structure, and therefore at least achieves the advantage of increasing the depth-to-width ratio while reducing the manufacturing difficulty. For the specific effect, refer to the description above. Details are not described herein again.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present application. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A method of manufacturing a semiconductor structure, comprising:
    forming a capacitor on a substrate, wherein the capacitor comprises a plurality of first electrodes arranged at intervals, a first dielectric layer covers a side surface and a top surface of each of the first electrodes, a second electrode covers the first dielectric layer, a second conductive layer covers the second electrode and fills up a space between the second electrode, and a first support layer is provided between parts of the first electrodes away from the substrate;
    removing part of the first electrode, part of the second electrode and part of the first dielectric layer to expose a surface of the first support layer away from the substrate and part of a side surface of the first support layer away from the substrate, wherein the surface of the first support layer away from the substrate is flush with a surface of the first electrode away from the substrate;
    forming, on the surface of the first support layer away from the substrate, a second support layer having a first hole structure, wherein the first support layer and the second support layer form a new first support layer;
    forming, on a side surface of the first hole structure, a third electrode in contact with the first electrode, wherein the first electrode and the third electrode form a new first electrode;
    forming a second dielectric layer covering the third electrode and being in contact with the first dielectric layer, wherein the first dielectric layer and the second dielectric layer form a new first dielectric layer; and
    forming, on a side surface of the second dielectric layer, a fourth electrode in contact with the second electrode, wherein the second electrode and the fourth electrode form a new second electrode.

2. The method of manufacturing according to claim 1, wherein the second support layer comprises an extension layer and an insulating layer covering the extension layer; and
    the forming, on the surface of the first support layer away from the substrate, a second support layer having a first hole structure comprises:
    forming the extension layer on an exposed surface of the second support layer, wherein the extension layer has a second hole structure;
    etching a side surface of the second hole structure, to expose part of the surface of the first support layer away from the substrate; and
    forming the insulating layer on the etched side surface of the second hole structure and the extension layer, wherein the insulating layer located in the second hole structure defines the first hole structure.

3. The method of manufacturing according to claim 2, wherein the extension layer is formed on the first support layer through selective epitaxial growth.

4. The method of manufacturing according to claim 2, wherein the first electrode comprises a bottom wall and a sidewall peripherally surrounding the bottom wall, the bottom wall and the sidewall enclosing a first space; and
    the forming a capacitor on a substrate, wherein the capacitor comprises a plurality of first electrodes arranged at intervals, a first dielectric layer covers a side surface and a top surface of each of the first electrodes, a second electrode covers the first dielectric layer, and a first support layer is provided between parts of the first electrodes away from the substrate comprises:

providing the substrate, wherein a plurality of contact pads arranged at intervals are formed in the substrate;

forming the plurality of first electrodes that are arranged at intervals on the substrate, wherein a bottom wall of each of the first electrodes is electrically connected to one of the contact pads;

forming the first dielectric layer covering the first electrodes and the substrate, wherein the first dielectric layer located in the first space defines a second space; and forming the second electrode covering the first dielectric layer, wherein the second electrode located in the second space defines a third space.

5. The method of manufacturing according to claim 4, after the forming the second electrode covering the first dielectric layer, wherein the second electrode located in the second space defines a third space, further comprising:

forming a second conductive layer covering the second electrode, wherein the second conductive layer fills up the third space and covers a surface of the second electrode away from the substrate.

6. The method of manufacturing according to claim 1, wherein the forming, on a side surface of the first hole structure, a third electrode in contact with the first electrode comprises:

depositing the third electrode on the side surface and a bottom surface of the first hole structure and on the second support layer, wherein the third electrode located in the first hole structure defines a third hole structure; and etching the third electrode to remove the third electrode located on the second support layer and a bottom surface of the third hole structure.

7. The method of manufacturing according to claim 6, wherein a surface of the third electrode away from the substrate is lower than a surface of the second support layer away from the substrate.

8. The method of manufacturing according to claim 6, wherein the forming a second dielectric layer covering the third electrode and being in contact with the first dielectric layer comprises:

depositing the second dielectric layer on a side surface and a bottom surface of the third hole structure, the third electrode, and the second support layer, wherein the second dielectric layer located in the third hole structure defines a fourth hole structure; and etching the second dielectric layer to remove the second dielectric layer located on the second support layer and a bottom surface of the fourth hole structure.

9. The method of manufacturing according to claim 8, wherein the forming, on a side surface of the second dielectric layer, a fourth electrode in contact with the second electrode comprises:

depositing the fourth electrode in the fourth hole structure, on the second dielectric layer, and on the second support layer.

10. The method of manufacturing according to claim 9, wherein the fourth electrode fills up the fourth hole structure; or the fourth electrode covers a side surface and the bottom surface of the fourth hole structure, wherein the fourth electrode located in the fourth hole structure defines a fifth hole structure.

11. The method of manufacturing according to claim 1, after the forming, on a side surface of the second dielectric layer, a fourth electrode in contact with the second electrode, further comprising:

depositing a first conductive layer on the fourth electrode, wherein a surface of the first conductive layer away from the substrate is higher than a surface of the fourth electrode away from the substrate.

12. The method of manufacturing according to claim 1, after the removing part of the second electrode and part of the first dielectric layer to expose a surface of the first support layer away from the substrate, further comprising:

repeating the following steps at least twice:

the forming, on the surface of the first support layer away from the substrate, a second support layer having a first hole structure, wherein the first support layer and the second support layer form a new first support layer;

the forming, on a side surface of the first hole structure, a third electrode in contact with the first electrode, wherein the first electrode and the third electrode form a new first electrode;

the forming a second dielectric layer covering the third electrode and being in contact with the first dielectric layer, wherein the first dielectric layer and the second dielectric layer form a new first dielectric layer; and the forming, on a side surface of the second dielectric layer, a fourth electrode in contact with the second electrode, wherein the second electrode and the fourth electrode form a new second electrode;

wherein the foregoing steps are repeated until a total height of the first electrode and the repeatedly formed third electrodes along a direction perpendicular to the substrate reaches a preset value.

13. A semiconductor structure, manufactured by the method of manufacturing the semiconductor structure according to claim 1.

* * * * *